(12) United States Patent
Hasei et al.

(10) Patent No.: US 7,892,607 B2
(45) Date of Patent: Feb. 22, 2011

(54) MULTILAYER FILM, ELECTROOPTIC DEVICE, ELECTRONIC APPARATUS, AND PROCESS FOR FORMING MULTILAYER FILM

(75) Inventors: Hironori Hasei, Okaya (JP); Akira Inagaki, Suwa (JP)

(73) Assignee: Seiko Epson Corporation (JP)

( * ) Notice: Subject to any disclaimer, the term of this patent is extended or adjusted under 35 U.S.C. 154(b) by 951 days.

(21) Appl. No.: 11/383,016

(22) Filed: May 12, 2006

(65) Prior Publication Data

US 2006/0256179 A1 Nov. 16, 2006

(30) Foreign Application Priority Data

May 16, 2005 (JP) ............................. 2005-142194

(51) Int. Cl.
*B05D 5/12* (2006.01)
*B05D 1/38* (2006.01)
*B05D 3/10* (2006.01)

(52) U.S. Cl. .................................. 427/419.1

(58) Field of Classification Search ................ 427/402, 427/307, 335, 336, 337
See application file for complete search history.

(56) References Cited

U.S. PATENT DOCUMENTS 5,490,962 A * 2/1996 Cima et al. ................. 264/401
7,056,180 B2 6/2006 Morii
2002/0093283 A1 * 7/2002 Seo et al. .................... 313/504
2005/0007398 A1 1/2005 Hirai
2005/0170737 A1 8/2005 Seo et al.

FOREIGN PATENT DOCUMENTS

| JP | 2773297 | | 4/1998 |
|---|---|---|---|
| JP | 11-256150 A | * | 9/1999 |
| JP | 2002-110352 | | 4/2002 |
| JP | 2002-289352 | | 10/2002 |
| JP | 2003-315813 | | 11/2003 |
| JP | 2004-006578 | | 1/2004 |
| JP | 2004-063138 | | 2/2004 |
| JP | 2004-207142 | | 7/2004 |
| JP | 2004-296668 | | 10/2004 |
| JP | 2004-349640 | | 12/2004 |
| JP | 2005-019955 | | 1/2005 |

* cited by examiner

*Primary Examiner*—William Phillip Fletcher, III
(74) *Attorney, Agent, or Firm*—Harness, Dickey & Pierce, P.L.C.

(57) ABSTRACT

A process for forming a multilayer film includes (a) discharging a first functional liquid containing a first functional material on a substrate by a droplet discharge method to form a lower layer, (b) solidifying the first functional liquid on the substrate to form a solid lower layer containing the first functional material, (c) forming a liquid layer containing the first functional material on the solid lower layer, (d) discharging a second functional liquid containing a second functional material on the liquid layer and the solid lower layer by the droplet discharge method to form an upper layer, and (e) solidifying the liquid layer and the second functional liquid to form a solid upper layer.

14 Claims, 10 Drawing Sheets

MULTILAYER FILM, ELECTROOPTIC DEVICE, ELECTRONIC APPARATUS, AND PROCESS FOR FORMING MULTILAYER FILM

BACKGROUND

1. Technical Field

The present invention relates to a multilayer film, an electrooptic device, an electronic apparatus, and a process for forming the multilayer film.

2. Related Art

In recent years, film-forming techniques employing droplet discharge methods, i.e., inkjet methods, have been used in the production of interconnections and functional elements. In a known film-forming technique, a functional film is formed by disposing a liquid (functional liquid) containing a functional material on a substrate with a drawing device such as an inkjet printer to form a pattern; and performing drying or the like on the disposed functional liquid. Such a film-forming technology can be applied to high-mix low-volume production and is significantly effective.

In the production of a functional element or the like by the film-forming technique, a plurality of types of functional films can be laminated by successively repeating the drawing and drying steps. For example, JP-A-2004-63138 discloses a process for producing a functional element including a hole-transporting layer and a luminescent layer by the droplet discharge method. Furthermore, JP-A-2003-315813 discloses a process for producing an interconnection formed of an underlying layer and a conductive layer by the droplet discharge method.

In such a multilayered functional film (hereinafter, referred to as a "multilayer film"), the adhesion and contact properties between the layers may significantly affect reliability and characteristics. For example, in the interconnection formed of the two layers, the adhesion between the layers affects interface resistance and delamination resistance between the layers. In the luminescent element, the luminescence occurs in the vicinity of the interface between the hole-transporting layer and the luminescent layer in the luminescent element. JP-A-2002-110352 and Japanese Patent No. 2,773,297 disclose that the contact area between the layers is closely related to the luminous efficiency.

However, the known process for forming the multilayer film by the droplet discharge method is not sufficient for the improvement of the adhesion and contact properties between the layers.

SUMMARY

An advantage of the invention is that it provides a process for forming a multilayer film formed of different types of functional material layers, the multilayer film having satisfactory adhesion and contact properties between the layers. Another advantage of the invention is that it provides the multilayer film and an electrooptic device and an electronic apparatus that include the multilayer film.

According to an aspect of the invention, a process for forming a multilayer film includes (a) discharging a first functional liquid containing a first functional material on a substrate by a droplet discharge method to form a lower layer; (b) solidifying the first functional liquid on the substrate to form a solid lower layer containing the first functional material; (c) forming a liquid layer containing the first functional material on the solid lower layer; (d) discharging a second functional liquid containing a second functional material on the liquid layer and the solid lower layer by the droplet discharge method to form an upper layer; and (e) solidifying the liquid layer and the second functional liquid to form a solid upper layer.

In this case, the second functional liquid containing the second functional material is disposed on the liquid layer on the solid lower layer containing the first functional material; hence, the first and second materials can flow between the second functional liquid and the solid lower layer. Then, the resulting stacked layers are solidified. That is, the first and second functional materials diffuse in the interface region between the solid lower layer and the second functional liquid to form the multilayer film having suitable adhesion and contact properties between the solid lower layer and the solid upper layer.

In this case, step (c) is preferably a step of discharging a redissolving liquid on the solid lower layer by the droplet discharge method, the redissolving liquid being used for redissolving the solid lower layer.

More preferably, the redissolving liquid is composed of the liquid component of the first functional liquid.

In this case, discharging the redissolving liquid by the droplet discharge method liquefies the surface of the solid lower layer containing the first functional material, thus easily forming the liquid layer. Furthermore, the redissolving liquid composed of the liquid component of the first functional liquid is preferably used, thereby effectively redissolving the surface of the solid lower layer.

In this case, step (c) is preferably a step of discharging the first functional liquid on the solid lower layer by the droplet discharge method.

In this case, discharging the first functional liquid by the droplet discharge method easily forms the liquid layer.

Preferably, the process further includes (a') forming a bank demarcating a predetermined region before step (a).

The term "bank" defined here refers to a three-dimensional structure composed of a resin or the like. In the process for forming the multilayer film according to an aspect of the invention, the bank surely specifies the in-plane position of the functional liquid on the substrate, thereby realizing satisfactory lamination of the solid lower layer containing the first functional material and the solid upper layer containing the second functional material.

Preferably, the first functional material and the second functional material act complementarily to exert predetermined functions.

In this case, the functional materials disperse in the interface region. This substantially increases the contact area between the solid lower layer containing the first functional material and the solid upper layer containing the second functional material, thus resulting in the multilayer film having satisfactory functional efficiency.

A multilayer film according to another aspect of the invention is produced by forming a liquid layer on a solid layer containing a first functional material on a substrate, discharging a functional liquid containing a second functional material on the liquid layer by a droplet discharge method, and solidifying the functional liquid and the liquid layer.

In this case, the second functional liquid containing the second functional material is disposed on the liquid layer on the solid lower layer containing the first functional material; hence, the first and second materials can flow between the second functional liquid and the solid lower layer. Then, the resulting stacked layers are solidified. That is, the first and second functional materials diffuse in the interface region between the solid lower layer and the second functional liquid to form the multilayer film having suitable adhesion and contact properties between the solid lower layer and the solid upper layer.

An electrooptic device according to another aspect of the invention includes the multilayer film described above.

In this case, the electrooptic device includes the multilayer film having satisfactory interlayer adhesion and thus has satisfactory reliability and the like.

An electronic apparatus according to another aspect of the invention includes the multilayer film described above.

In this case, the electronic apparatus includes the multilayer film having satisfactory interlayer adhesion and thus has satisfactory reliability and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
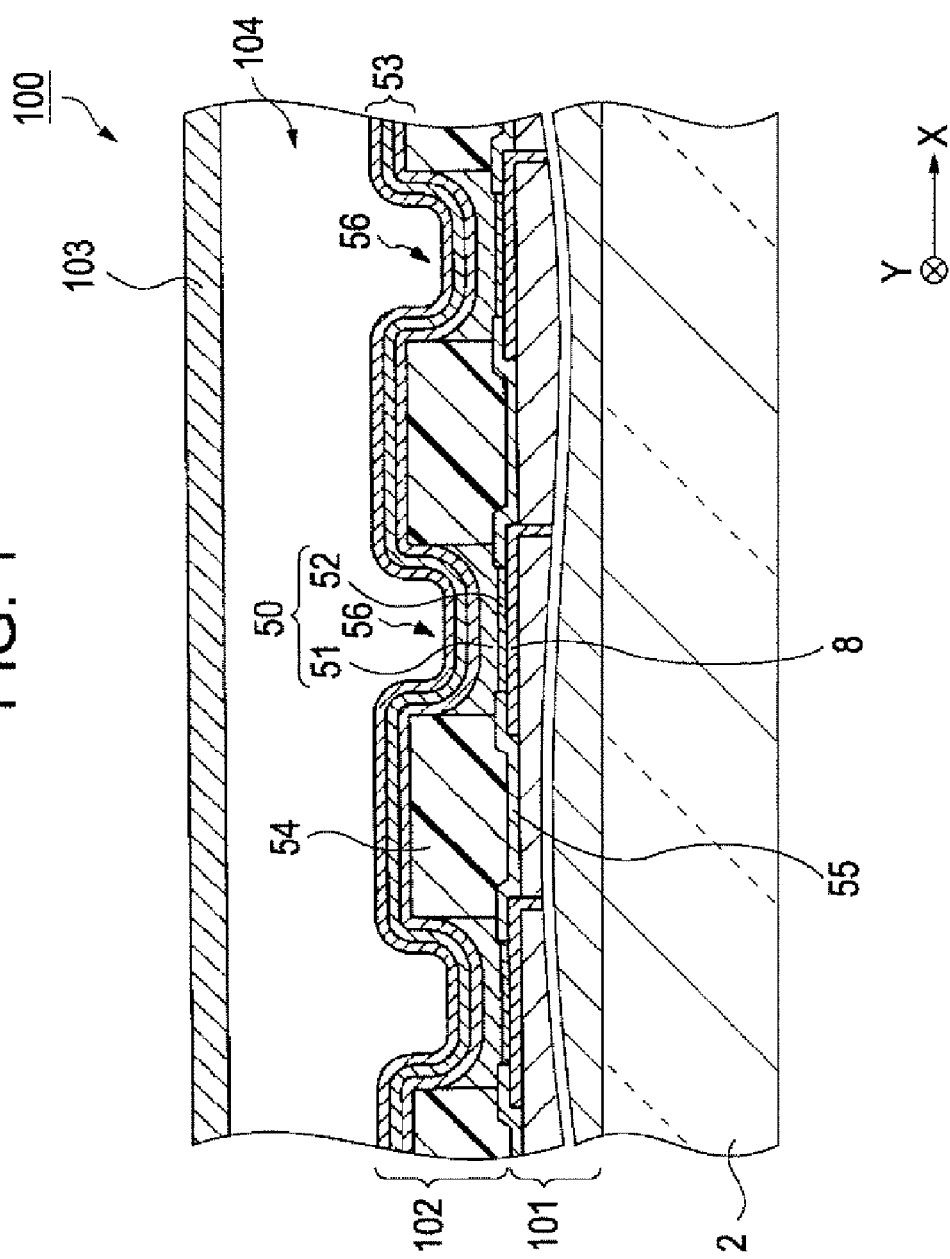
FIG. 1 is a fragmentary cross-sectional view of an electrooptic device in accordance with an embodiment of the invention.

Preferred embodiments of the invention will be described in detail below on the basis of the drawings. The preferred embodiments are limited by technically suitable conditions. However, the scope of the invention is not limited to these embodiments unless otherwise specified. Layers and components are shown at different scales so as to be recognizable in the drawings.

First Embodiment

Electrooptic Device

Figure 2:
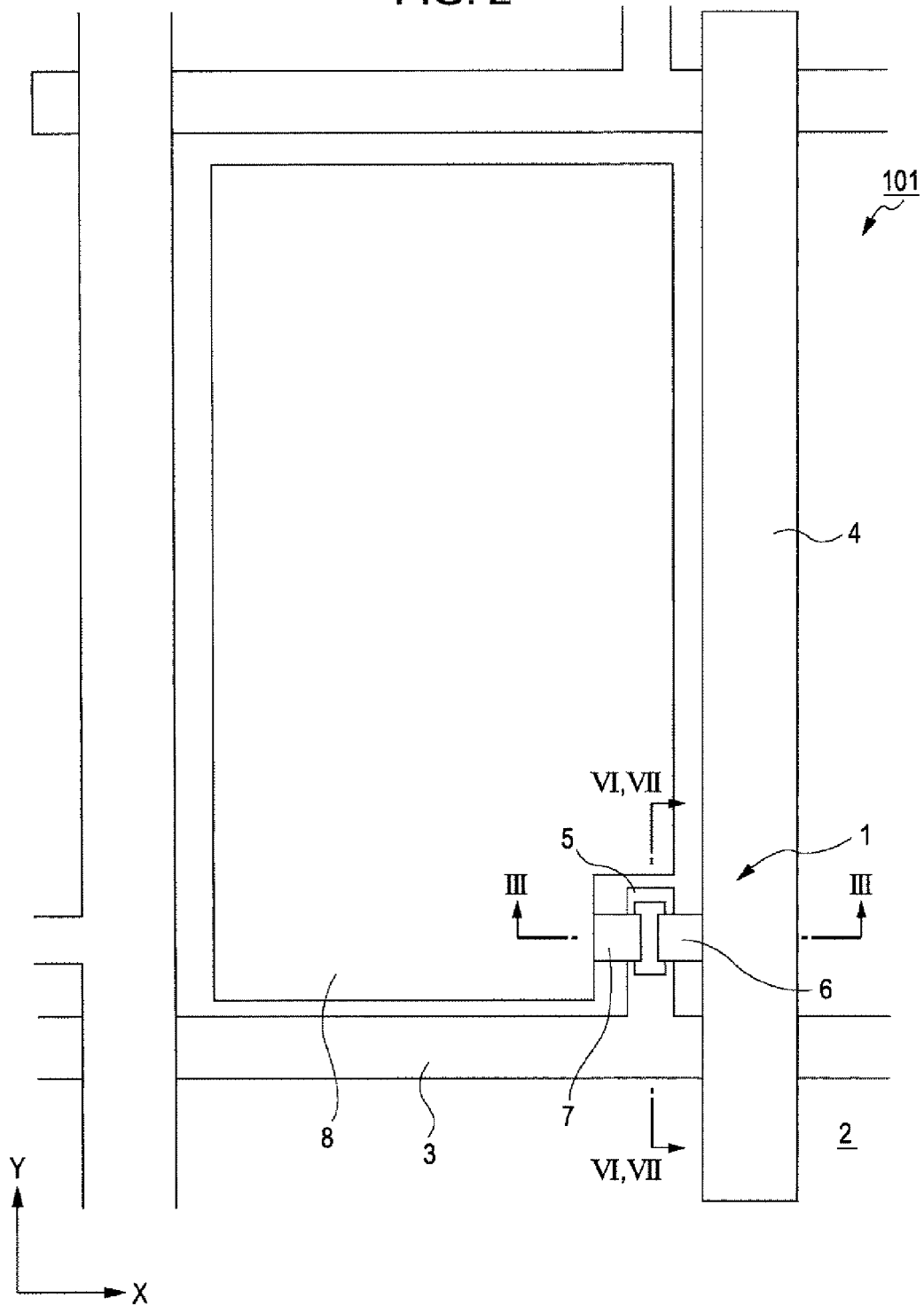
FIG. 2 is a plan view of the driving circuit portion of the electrooptic device.
Figure 3:
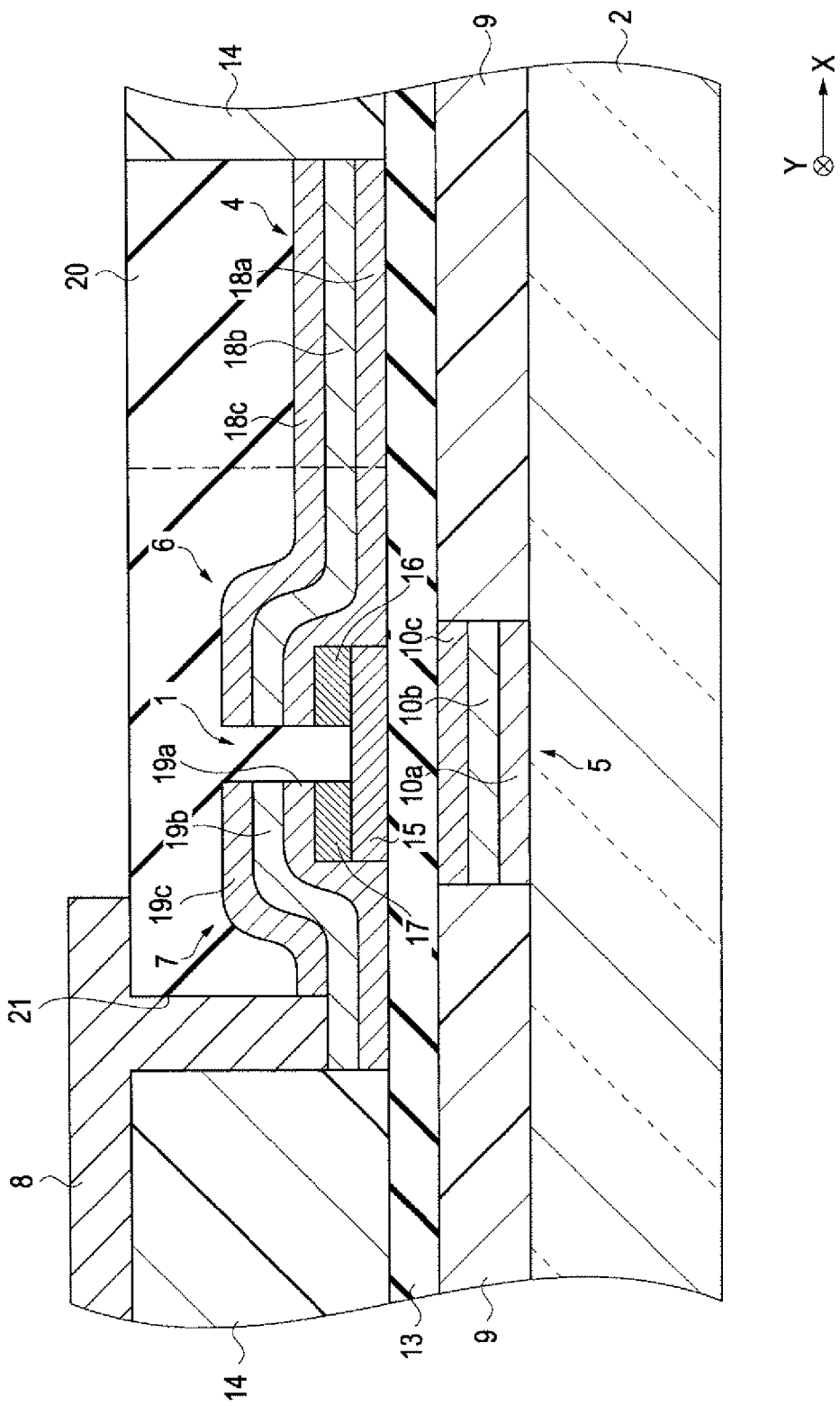
FIG. 3 is a cross-sectional view of a driving element and its peripheral structure, the view being taken along the line III-III in FIG. 2.

An electrooptic device in accordance with the invention will be described with reference to FIGS. 1, 2, and 3. FIG. 1 is a fragmentary cross-sectional view of the electrooptic device in accordance with an embodiment of the invention. FIG. 2 is a plan view of the driving circuit portion of the electrooptic device. FIG. 3 is a cross-sectional view of a driving element and its peripheral structure, the view being taken along the line III-III in FIG. 2.

As shown in FIG. 1, an electrooptic device 100 includes an elemental substrate 2, a driving circuit portion 101 on the elemental substrate 2, a luminescent element portion 102 on the driving circuit portion 101, and a sealing substrate 103 for sealing the driving circuit portion 101 and the luminescent element portion 102, the sealing substrate 103 being remote from the elemental substrate 2. The elemental substrate 2 is preferably a glass substrate. A sealed cavity 104 sealed with the sealing substrate 103 is filled with an inert gas.

The luminescent element portion 102 includes a plurality of recesses demarcated by banks 54. Luminescent elements 56 are disposed in the recesses and are each formed of a multilayer film. The luminescent elements 56 each function as a pixel. Shading films 55 are disposed between the driving circuit portion 101 and the individual banks 54 in order to prevent interference between the pixels. The banks 54 are each composed of an acrylic resin, a polyimide resin, or the like and are formed on the elemental substrate 2 by patterning.

The luminescent elements 56 each include a segment electrode 8 (anode) serving as an output terminal of the driving circuit portion 101, a common electrode 53 (cathode), and a luminescent film 50 between the segment electrode 8 and the common electrode 53. The luminescent films 50 are each a multilayer film including a hole-transporting layer 52 and an organic electroluminescent layer 51 (hereinafter, referred to as an "organic EL layer 51").

The segment electrodes 8 are each composed of a transparent conductive material such as indium tin oxide. The common electrode 53 is, for example, a three-layer film including an elemental calcium layer and a silver-magnesium alloy layer. The hole-transporting layer 52 in the luminescent films 50 each transport holes to the corresponding organic EL layer 51 and are each composed of a conductive polymer such as a doped polythiophene derivative (hereinafter, referred to as "PEDOT"). The organic EL layers 51 are each composed of a known organic electroluminescent material, such as a polyfluorene derivative, a (poly)paraphenylene vinylene derivative, or a polyphenylene derivative, that can fluoresce or phosphoresce. A specific process for producing the luminescent elements 56 will be described below.

In the above-described structure, when a voltage is applied between the common electrode 53 and the segment electrodes 8 with the driving circuit portion 101, holes are injected from the hole-transporting layers 52 to the organic EL layers 51. As a result, the holes are recombined with electrons from the common electrode 53 to emit light. This emission occurs in the vicinity of the interface between the hole-transporting layer 52 and the organic EL layer 51.

Referring to the plan view of the driving circuit portion 101 shown in FIG. 2, the driving circuit portion 101 includes conductive gate lines 3; conductive source lines 4, the gate lines 3 and the source lines 4 being arrayed in a matrix on the elemental substrate 2; and driving elements 1 disposed in the vicinity of the intersections of the gate lines 3 and the source lines 4. The driving elements 1 each include three electrodes: a gate electrode 5 extending perpendicularly to the direction of extension of each gate line 3; a source electrode 6 extending perpendicularly to the direction of extension of each source line 4; and a drain electrode 7 facing the source electrode 6 when viewed in plan, each of the drain electrodes 7 being electrically connected to the segment electrode 8. In the driving circuit portion 101, scan signals through the gate lines 3 and image signals through the source lines 4 control voltages applied to the segment electrodes 8 that correspond to the pixels.

Referring to the cross-sectional view of the driving circuit portion 101 shown in FIG. 3, the driving circuit portion 101 includes lower banks 9 on the surface of the elemental substrate 2; the gate electrodes 5 and the gate lines 3 (see FIG. 2) in the recesses demarcated by the lower banks 9; and a gate insulating layer 13 on the top surfaces of the gate electrodes 5 and the lower banks 9. The lower banks 9 are formed in the same way as the banks 54 (see FIG. 1). The gate insulating layer 13 is composed of silicon nitride or the like and formed by chemical vapor deposition (CVD) or the like.

Each gate electrode 5 and each gate line 3 (see FIG. 2) are each formed of a multilayer film including an underlying gate layer 10a composed of elemental manganese or a manganese alloy; a gate conductive layer 10b composed of elemental silver or a silver alloy; and a gate covering layer 10c composed of elemental nickel or a nickel alloy. The gate electrodes 5 and the gate lines 3 (see FIG. 2) including the layers are simultaneously formed by patterning by a droplet discharge method. This process will be described in detail below.

The gate conductive layers 10b function as conductive lines. The underlying gate layers 10a are each disposed between the gate conductive layer 10b and the elemental substrate 2 in order to improve the adhesion of the gate conductive layer 10b to the elemental substrate 2. In particular, at the gate electrodes 5 (see FIG. 2) each having a narrow line width, the underlying gate layers 10a suitably prevent delamination of the gate electrodes 5 from the elemental substrate 2. The gate conductive layers 10b contain silver that diffuses easily. Thus, the gate covering layers 10c function as cap layers for preventing the diffusion of silver.

The driving circuit portion 101 includes upper banks 14 on the top surface of the gate insulating layer 13; a channel layer 15 opposite the gate electrode 5, the gate insulating layer 13 and the gate electrode 5 being separated by the gate insulating layer 13; connecting layers 16 and 17 on the channel layer 15, the connecting layers 16 and 17 being spaced at a predetermined interval; the source electrode 6 (source line 4) being in contact with the connecting layer 16; and the drain electrode 7 being in contact with the connecting layer 17.

The channel layer 15 is composed of amorphous silicon. The connecting layers 16 and 17 are each composed of n+ amorphous silicon. The source electrode 6 and the source line 4 are each formed of a multilayer film including a lower source layer 18a composed of elemental nickel or a nickel alloy; a source conductive layer 18b composed of elemental silver or a silver alloy; and an upper source layer 18c composed of elemental nickel or a nickel alloy. The drain electrode 7 is also a multilayer film having the same structure as that of the source electrode 6. The drain electrode 7 includes a lower drain layer 19a, a drain conductive layer 19b, and an upper drain layer 19c.

The upper banks are formed by the same patterning as that for the banks 54 so as to demarcate regions for forming the source line 4 and the driving element 1 (see FIG. 2). The channel layer 15 and the connecting layers 16 and 17 are formed by CVD and photolithography. The source line 4, the source electrode 6, and the drain electrode 7 are formed by the same droplet discharge method as that for the gate electrode 5 and the gate line 3 (see FIG. 2). Then, the recess demarcated by the upper banks 14 is filled with an insulating layer 20. A hole 21 is formed from the drain electrode 7 to the upper surface of the insulating layer 20 and filled with a conductive material to complete the structure shown in FIG. 3.

Droplet Discharge System

Figure 4:
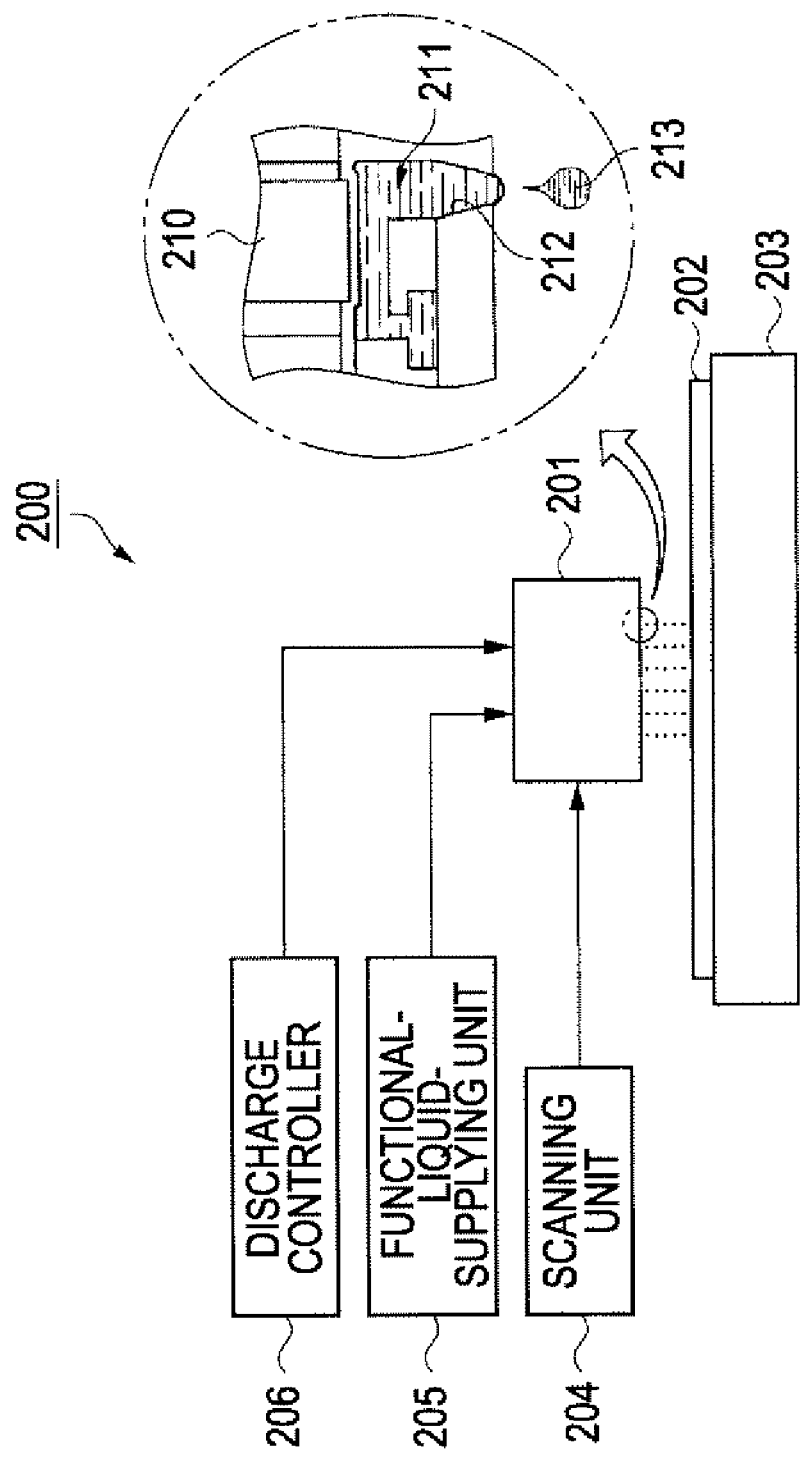
FIG. 4 is a schematic view of a droplet discharge system in accordance with an embodiment of the invention.

Referring now to FIG. 4, the droplet discharge system for use in the droplet discharge method will be described. FIG. 4 is a schematic view of a droplet discharge system in accordance with an embodiment of the invention.

As shown in FIG. 4, a droplet discharge system 200 includes a discharge head 201 having a plurality of nozzles 212 at a face of the head; and a platform 203 for placing a substrate 202, the platform 203 facing the discharge head 201. Furthermore, the droplet discharge system 200 also includes a scan unit 204 for moving the discharge head 201 longitudinally and transversely while the distance between the discharge head 201 and the substrate 202 is maintained; a functional-solution-supplying unit 205 for supplying the discharge head 201 with a functional liquid; and a discharge controller 206 for controlling discharging from the discharge head 201.

The discharge head 201 includes a microscopic, branched passage. The passage has a cavity 211 and the nozzle 212 at an end of the passage. A wall of the cavity 211 can be deformed by a piezoelectric element 210. A pressure is produced by a driving signal from the discharge controller 206 in the cavity 211 to discharge a droplet 213 from the nozzle 212. With respect to discharging techniques, there is a process in which a pressure is produced by transforming an electrical signal into heat, i.e., a thermal process, in addition to such an electromechanical process.

In the above-described system, the discharge from each nozzle 212 is controlled in synchronization with the scan of the discharge head 201 to dispose a functional liquid on the substrate 202 in a predetermined pattern. The droplet discharge system 200 can also be configured to discharge a plurality of functional liquids in a single scan.

Process for Forming Gate Line

Figure 5:
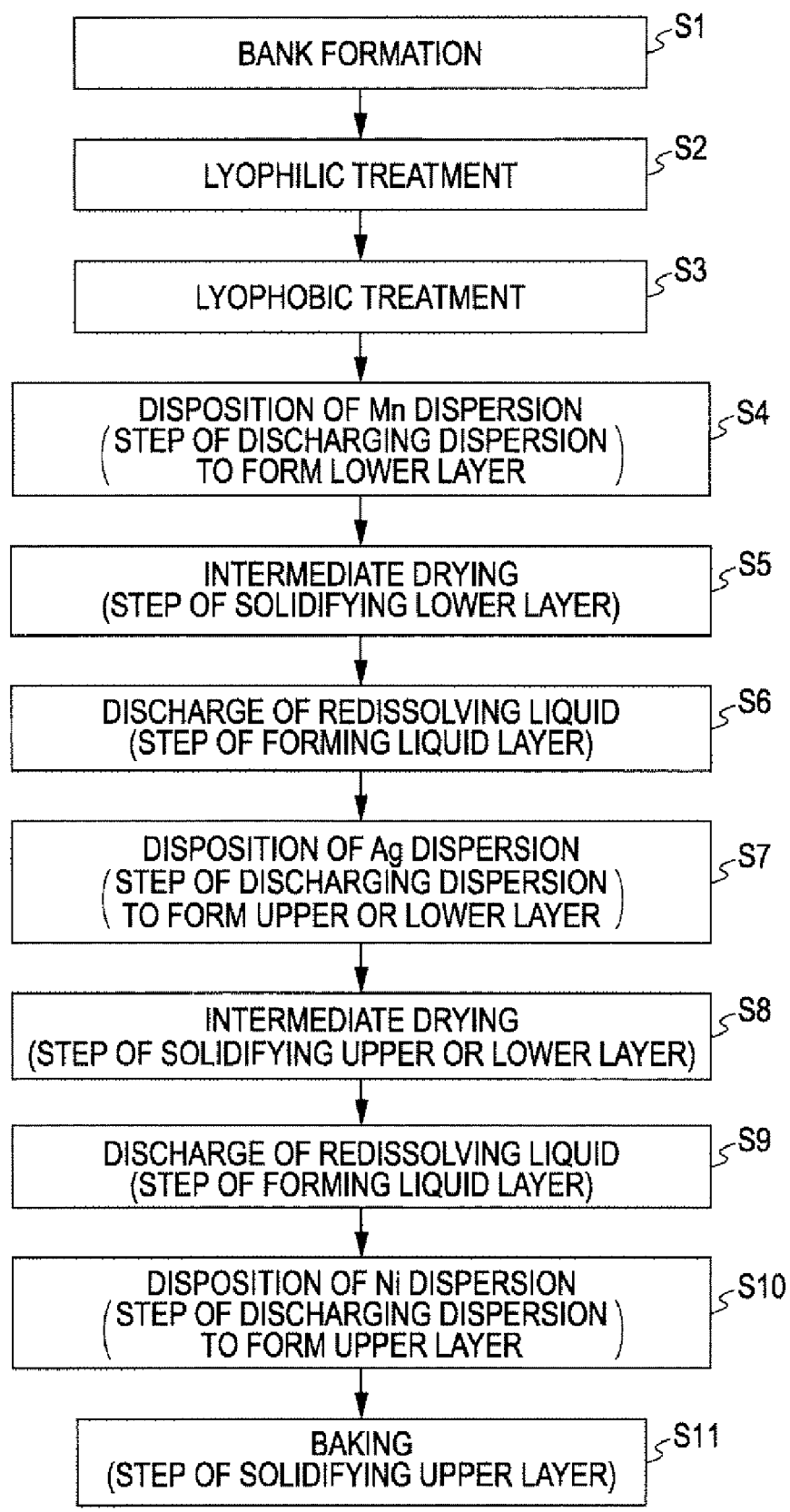
FIG. 5 is a flowchart of a process for forming a gate line.

In accordance with the flowchart shown in FIG. 5, a process for forming the gate lines including the gate electrodes will be described with reference to FIGS. 6A to 6D and 7E to 7G. FIG. 5 is the flowchart of the process for producing the gate lines. FIGS. 6A to 6D are each a cross-sectional view showing a step in the process for forming the gate line, the view being taken along the line VI-VI in FIG. 2. FIGS. 7E to 7G are each a cross-sectional view showing a step in the process for forming the gate line, the view being taken along the line VII-VII in FIG. 2.

Functional liquids to be discharged by the droplet discharge system 200 (see FIG. 4) are prepared before the formation of the gate lines 3 (gate electrode 5). The term "functional liquid" defined here refers to a dispersion containing fine particles of a functional material in a liquid. Specifically, a Mn dispersion containing elemental manganese or a manganese alloy (hereinafter, simply referred to as "Mn") as the functional material; a Ag dispersion containing elemental silver or a silver alloy (hereinafter, simply referred to as "Ag") as the functional material; and a Ni dispersion containing elemental nickel or a nickel alloy (hereinafter, simply referred to as "Ni") as the functional material are prepared. Furthermore, the surface of the fine particle of each functional material may be coated with an organic substance such as citric acid in order to improve dispersibility.

A dispersion medium used for each functional liquid is not particularly limited as long as the dispersion medium can disperse the fine particles without aggregation. Specific examples thereof include water; alcohols, such as methanol and ethanol; hydrocarbons such as n-heptane and toluene; ethers such as ethylene glycol dimethyl ether; and polar compounds, such as propylene carbonate and N-methyl-2-pyrrolidone. These may be used alone or in combination.

The vapor pressure of the dispersion medium, the dispersoid content, surface tension, viscosity, and specific gravity of each functional liquid is suitably adjusted in order to optimize the discharge properties and clogging in the droplet discharge system 200 (see FIG. 4), dispersion stability, dynamic properties on the substrate after discharging, and the rate of drying. Thus, each functional liquid may contain a surfactant, a humectant, viscosity adjuster, and the like. Furthermore, each functional liquid may further contain a binder in order to improve fixation after the formation of the film.

Figure 6A:
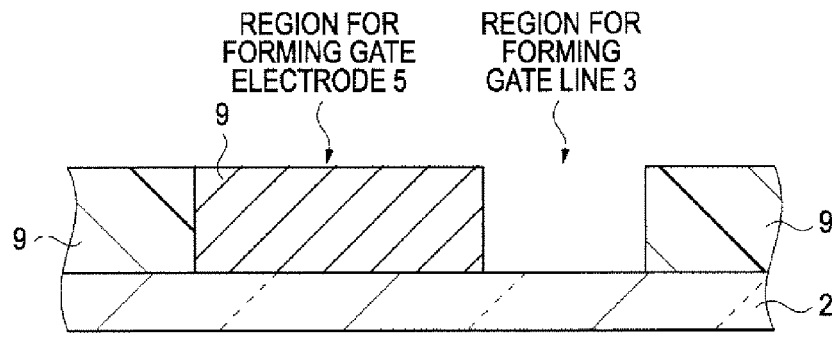
FIGS. 6A to 6D are each a cross-sectional view showing a step in the process for forming the gate line, the view being taken along the line VI-VI in FIG. 2.
Figure 7E:
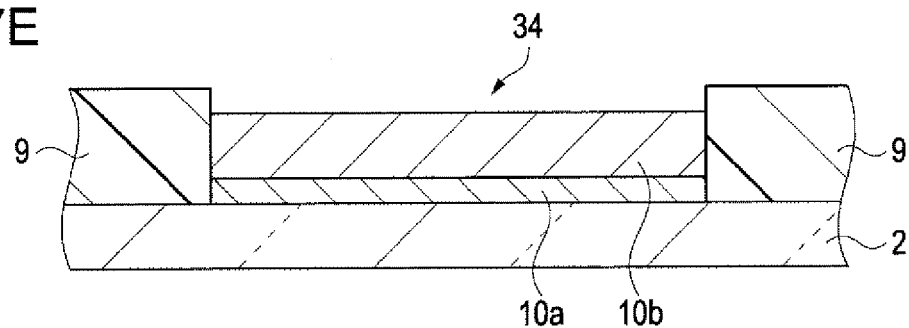
FIGS. 7E to 7G are each a cross-sectional view showing a step in the process for forming the gate line, the view being taken along the line VII-VII in FIG. 2.
Figure 7F:
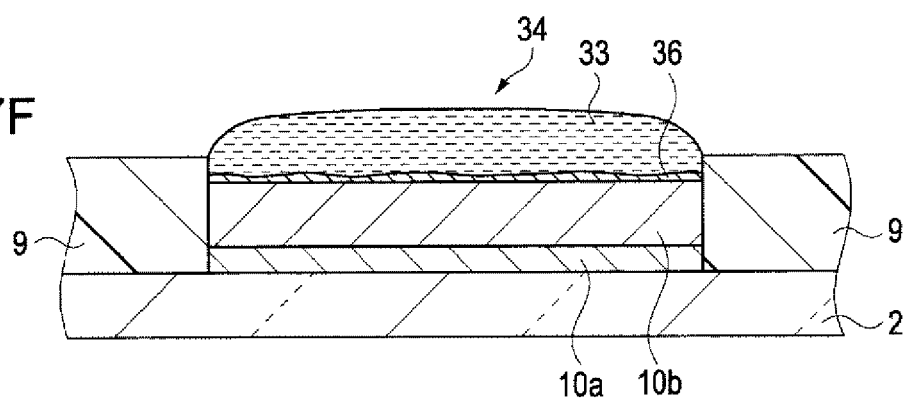
Figure 7G:
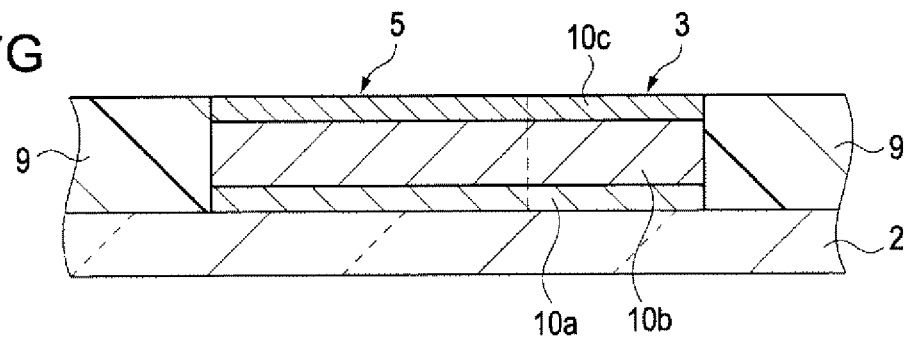

Referring now to FIG. 6A (see also FIG. 2), the lower banks 9 are formed on the glass elemental substrate 2 by patterning so as to demarcate a region for forming the gate line 3 (gate electrode 5) (step S1 shown in FIG. 5). Specifically, for example, a solution containing a polymeric resin or the like is applied by, for example, spin coating to form a film having a constant thickness, and then the resulting film is patterned by photolithography.

Lyophilic treatment is performed to the side where the lower banks 9 are disposed on the elemental substrate 2 by oxygen plasma treatment (step S2 shown in FIG. 5). The exposed surface of the elemental substrate 2 is cleaned by the lyophilic treatment to improve wettability and the nonuniformity of wettability.

Next, lyophobic treatment is performed to the side where the lower banks 9 are disposed on the elemental substrate 2 by, for example, plasma treatment with tetrafluoromethane ($CF_4$) (step S3 shown in FIG. 5). Fluorine groups are introduced to the surfaces of the lower banks 9 composed of the organic substance by the lyophobic treatment. As a result, the lower banks 9 have lyophobic surfaces. Although the exposed surface of the elemental substrate 2 is slightly affected by the plasma treatment, the lyophilic properties of the elemental substrate 2 are not affected. Alternatively, by using a lyophobic resin material, such as a fluorine group-containing resin material, as the resin material constituting the lower banks 9, the above-described lyophobic treatment may be omitted.

The Mn dispersion is disposed in a compartment 34 demarcated by the lower banks 9 produced by the droplet discharge method (step S4 of discharging the dispersion to form lower layer shown in FIG. 5). Even if part of the Mn dispersion is discharged to the outside of the compartment 34, the Mn dispersion is suitably disposed in the compartment 34 by virtue of the lyophobic properties of the lower banks 9 imparted by the lyophobic treatment.

Figure 6B:
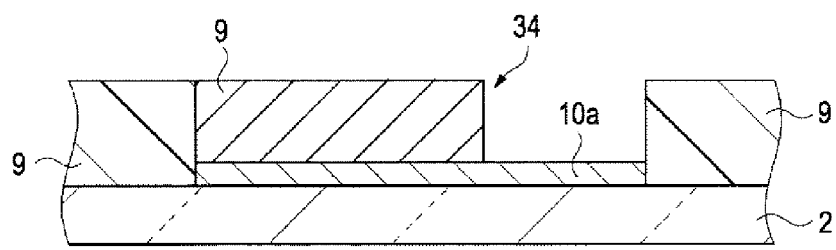

The Mn dispersion is dried by placing the elemental substrate 2 in a vacuum dryer or by allowing the elemental substrate 2 to stand, thereby solidifying the Mn dispersion (step S5 of solidifying the lower layer shown in FIG. 5). As a result, the underlying gate layer 10a is formed as shown in FIG. 6B. In step S5, the dispersion medium is not necessarily completely removed. The underlying gate layer 10a is preferably in a substantially nonfluid state.

Figure 6C:
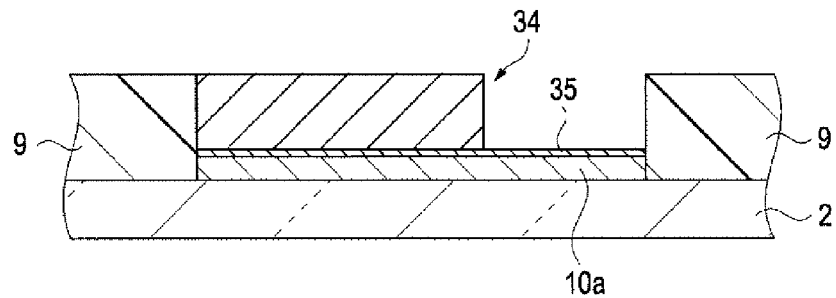

A redissolving liquid is discharged onto the underlying gate layer 10a in the compartment 34 by the droplet discharge method (step S6 of forming a liquid layer shown in FIG. 5). The redissolving liquid is composed of the liquid component, such as the dispersion medium and an additive, in the Mn dispersion. That is, the redissolving liquid is prepared such that the Mn fine particles in the underlying gate layer 10a disperse in the redissolving liquid and the surface portion of the underlying gate layer 10a dissolves in the redissolving liquid. Thereby, a liquid layer 35 is formed on the underlying gate layer 10a as shown in FIG. 6C. The liquid layer 35 is not necessarily formed on the entire surface of the underlying gate layer 10a. The liquid layer 35 may also be formed on part of the surface of the underlying gate layer 10a.

Figure 6D:
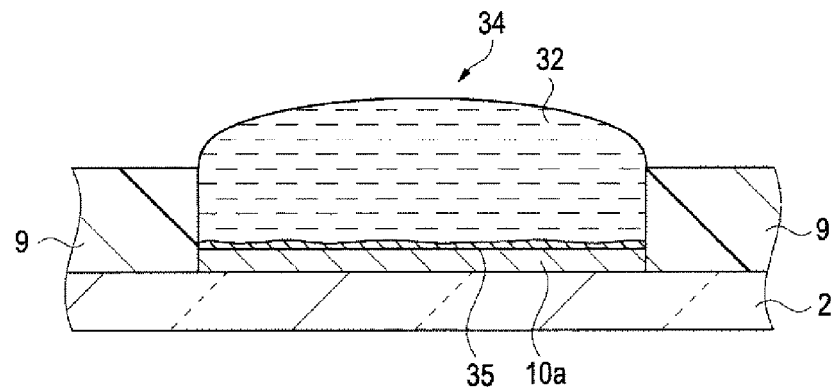

As shown in FIG. 6D, a Ag dispersion 32 is disposed in the compartment 34 by the droplet discharge method (step S7 shown in FIG. 5). The region where the Ag dispersion 32 is disposed is specified by the lower banks 9 such that the region has the same pattern as that of the underlying gate layer 10a; hence, the Ag dispersion 32 is surely disposed on the liquid layer 35 on the underlying gate layer 10a. Furthermore, the Mn particles from the underlying gate layer 10a and the Ag particles from the Ag dispersion 32 diffuse in the liquid layer 35.

The Ag dispersion 32 and the liquid layer 35 are dried by placing the elemental substrate 2 in a vacuum dryer or by allowing the elemental substrate 2 to stand, thereby solidifying the Ag dispersion 32 and the liquid layer 35 (step S8 shown in FIG. 5). As a result, the gate conductive layer 10b is formed from the Ag dispersion 32. The interface region between the underlying gate layer 10a and the gate conductive layer 10b is formed from the liquid layer 35. The interface region between the underlying gate layer 10a and the gate conductive layer 10b appropriately contains the Mn particles and the Ag particles; hence, the underlying gate layer 10a has suitable adhesion and contact properties to the gate conductive layer 10b. In step S8, the dispersion medium is not necessarily completely removed. The underlying gate layer 10a and the gate conductive layer 10b are preferably in substantially nonfluid states.

As shown in FIG. 7F, the redissolving liquid is discharged onto the gate conductive layer 10b in the compartment 34 by the droplet discharge method to form a liquid layer 36 (step S9 of forming the liquid layer shown in FIG. 5). Then, a Ni dispersion 33 is disposed in the compartment 34 by the droplet discharge method (step S10 of discharging the dispersion to form an upper layer shown in FIG. 5). The liquid layer 36 contains the Ag particles diffusing from the gate conductive layer 10b and the Ni particles diffusing from the Ni dispersion 33.

The elemental substrate 2 is placed in, for example, an electrically-heated oven and then baked (step S11 of solidifying the upper layer). As shown in FIG. 7G, the gate covering layer 10c is formed from the Ni dispersion 33. The interface region between the gate conductive layer 10b and the gate covering layer 10c is formed from the liquid layer 36. The interface region between the gate conductive layer 10b and the gate covering layer 10c appropriately contains the Ag particles and the Ni particles; hence, the gate conductive layer 10b has suitable adhesion and contact properties to the gate covering layer 10c.

The resulting gate line 3 (gate electrode 5) formed of the multilayer film has satisfactory interlayer adhesion, thus achieving satisfactory delamination resistance and high reliability. Furthermore, in the multilayer film, the contact areas between the layers are substantially increased, thus reducing the interface resistance. Therefore, the driving element 1 (see FIG. 1) can be efficiently supplied with an electrical signal, resulting in lower power consumption.

Process for Forming Luminescent Element

Figure 8:
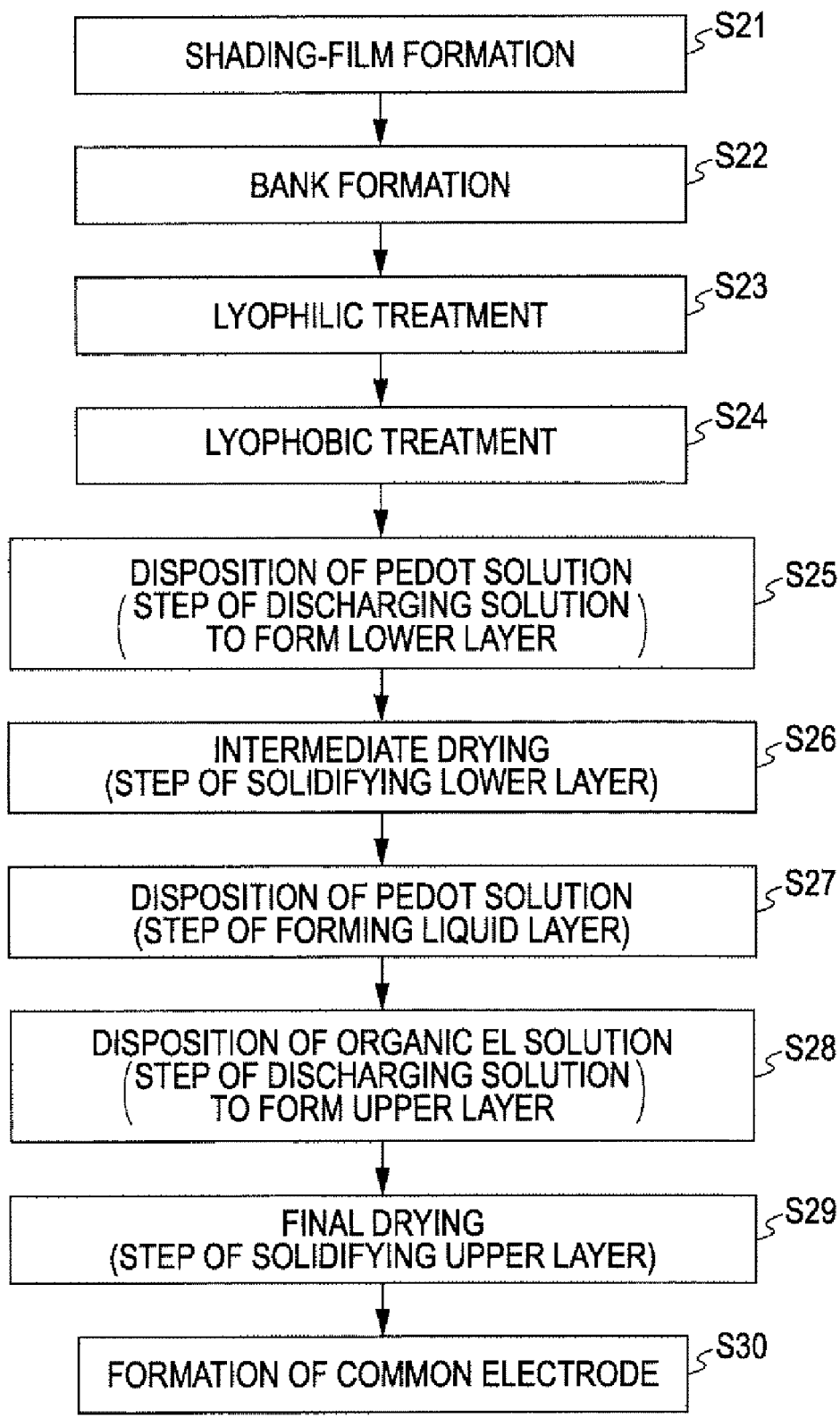
FIG. 8 is a flowchart showing a process for forming a luminescent element.

Referring to FIGS. 9A to 9D, a process for forming a luminescent element in accordance with a flowchart shown in FIG. 8. FIG. 8 is the flowchart showing the process for forming the luminescent element. FIGS. 9A to 9D are each a cross-sectional view showing a step in the process for forming the luminescent element. In FIGS. 9A to 9D, the driving circuit portions are omitted.

Functional liquids to be discharged by the droplet discharge system 200 (see FIG. 4) are prepared before the formation of the luminescent element. Specifically, a solution (PEDOT solution) containing Bytron P (manufactured by Bayer), which is one of PEDOT derivatives, as a functional material is prepared for the hole-transporting layer 52. A solution (organic EL solution) containing an organic EL material as a functional material is prepared for the organic EL layer 51. When the electrooptic device 100 (see FIG. 1) is of color displaying type, organic EL solutions having compositions corresponding to the three primary colors are prepared.

Figure 9A:
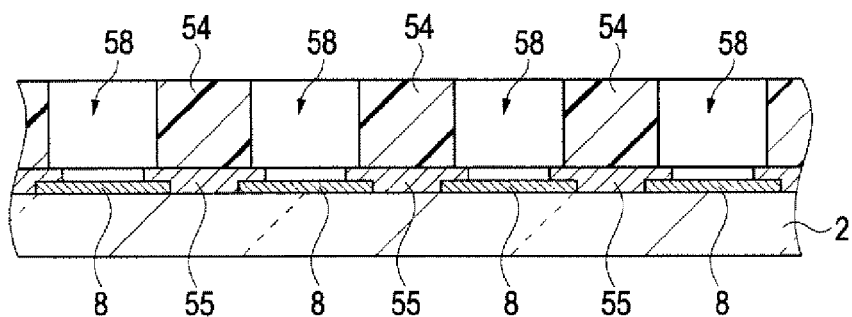
FIGS. 9A to 9D are each a cross-sectional view showing a step in the process for forming the luminescent element.

As shown in FIG. 9A, the shading films 55 are formed on the elemental substrate 2 having the segment electrodes 8 such that pixel regions 58 corresponding to the segment electrodes 8 are demarcated (step S21 shown in FIG. 8). Specifically, for example, the shading films 55 are formed by CVD and photolithography with a metal such as chromium.

The banks 54 are formed on the shading films 55 (step S22 shown in FIG. 8). Then, lyophilic treatment (step S23 shown in FIG. 8) and lyophobic treatment (step S24 shown in FIG. 8) are performed. These steps are performed as in the process for producing the gate lines.

Figure 9B:
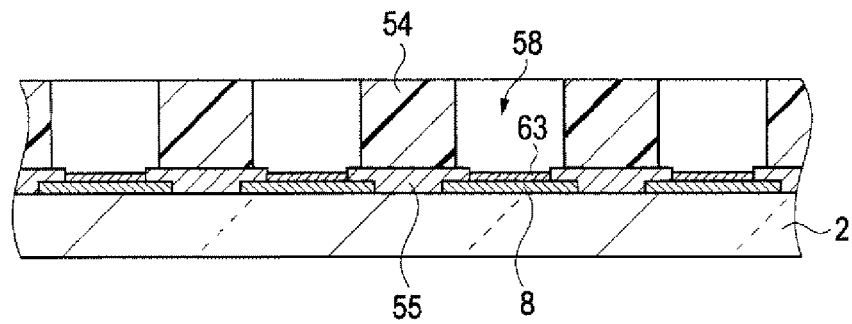

The PEDOT solution is disposed in the pixel regions 58 by the droplet discharge method (step S25 shown in FIG. 8). The PEDOT solution is dried by placing the elemental substrate 2 in a vacuum dryer or by allowing the elemental substrate 2 to stand (step S26 shown in FIG. 8). As a result, solid lower layers 63 containing PEDOT are formed as shown in FIG. 9B. The solid lower layers 63 have the same structure as those of the hole-transporting layer 52 in FIG. 1.

Figure 9C:
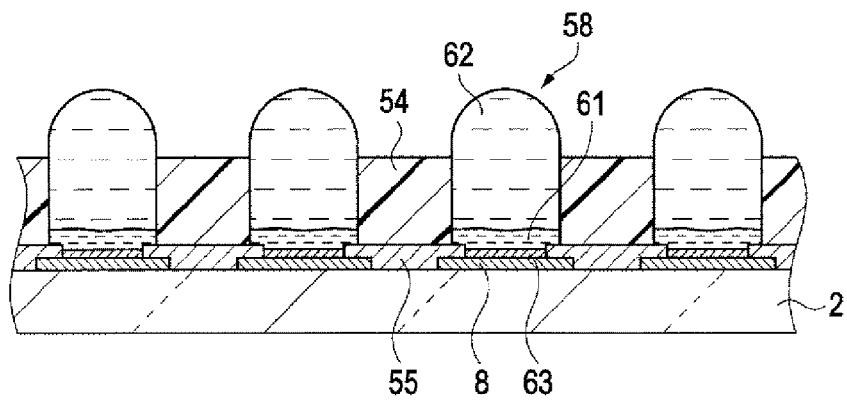

As shown in FIG. 9C, a PEDOT solution 61 is disposed on the solid lower layers 63 in the pixel regions 58 (step S27 of forming a liquid layer shown in FIG. 8) by the droplet discharge method.

An organic EL solution 62 is disposed on the PEDOT solution 61 in the pixel regions 58 by the droplet discharge method (step S28 of discharging the solution to form an upper layer shown in FIG. 8). At this time, the PEDOT material and the organic EL material diffuse in the interface region between the PEDOT solution 61 and the organic EL solution 62. However, the organic EL material does not diffuse in the solid lower layers 63 across the interface between the individual solid lower layers 63 and the PEDOT solution 61. The solid lower layers 63 function as solid regions for preventing the limitless progress of diffusion of the functional materials between adjacent functional materials. In this case, the solid regions are disposed under the functional material (PEDOT).

Figure 9D:
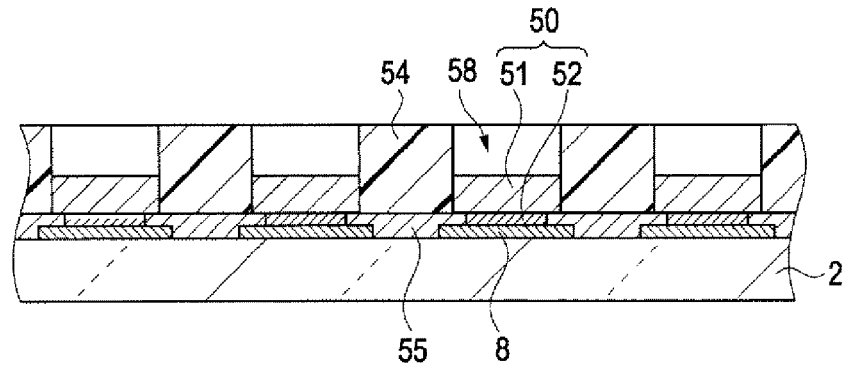

Drying is performed by placing the elemental substrate 2 in a vacuum dryer or the like to solidify the PEDOT solution 61 and the organic EL solution 62 (step S29 of solidifying the upper layer). As a result, as shown in FIG. 9D, the organic EL layers 51 are formed from the organic EL solution 62, and the hole-transporting layers 52 are formed from the combination of the organic EL layer 51 with the solid lower layers 63. Thereby, the luminescent films 50 are formed. The interface regions between the organic EL layers 51 and the hole-transporting layers 52 appropriately contains the organic EL material and PEDOT; hence, the organic EL layers 51 have suitable adhesion and contact properties to the hole-transporting layers 52.

The common electrode 53 (see FIG. 1) is formed over the luminescent films 50 by CVD or the like (step S30 shown in FIG. 8). Thereby, the luminescent elements 56 are completed. The common electrode 53 may also be formed by the droplet discharge method in the same way as the gate lines 3 (see FIG. 7).

In the resulting luminescent elements 56 (see FIG. 1) including the luminescent films 50 as the multilayer film, the contact areas between the organic EL layers 51 and the hole-transporting layers 52 are substantially increased. Thus, holes are efficiently injected into the organic EL layer 51, thereby leading to excellent luminescent properties.

Electronic Apparatus

Figure 10:
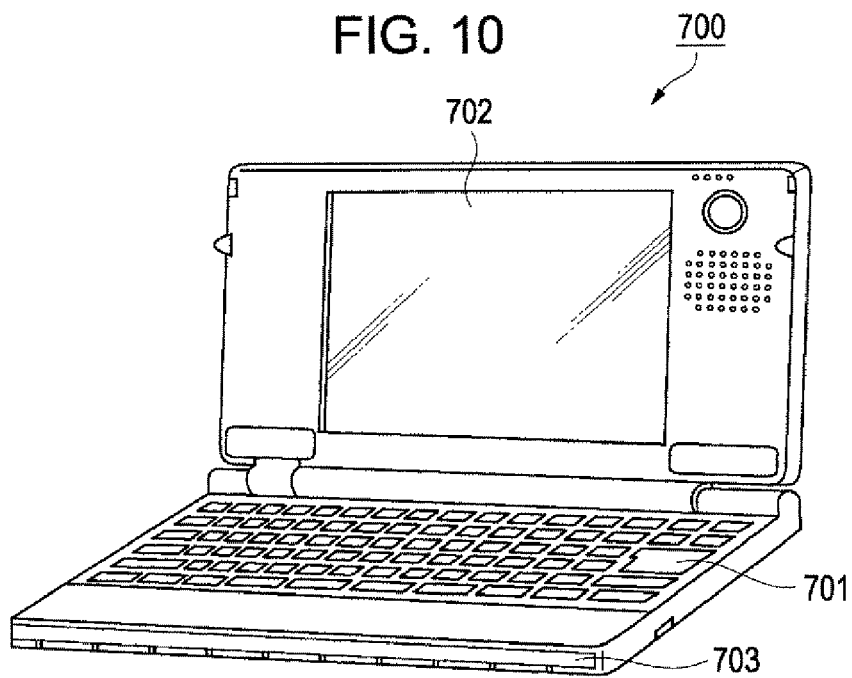
FIG. 10 is a schematic perspective view of an electronic apparatus in accordance with an embodiment of the invention.

Referring to FIG. 10, an example of an electronic apparatus will be described. FIG. 10 is a schematic perspective view of the electronic apparatus in accordance with an embodiment of the invention.

A portable information processor 700 as the electronic apparatus shown in FIG. 10 includes a keyboard 701, a main body 703, and a display 702. More specific examples of the portable information processor 700 include word processors and personal computers. The portable information processor 700 includes a control circuit board having conductive interconnections produced in the same way as the gate lines 3; and the above-described electrooptic device 100 as the display 702 and thus has low power consumption, high reliability, and excellent displaying properties.

Second Embodiment

Figure 11:
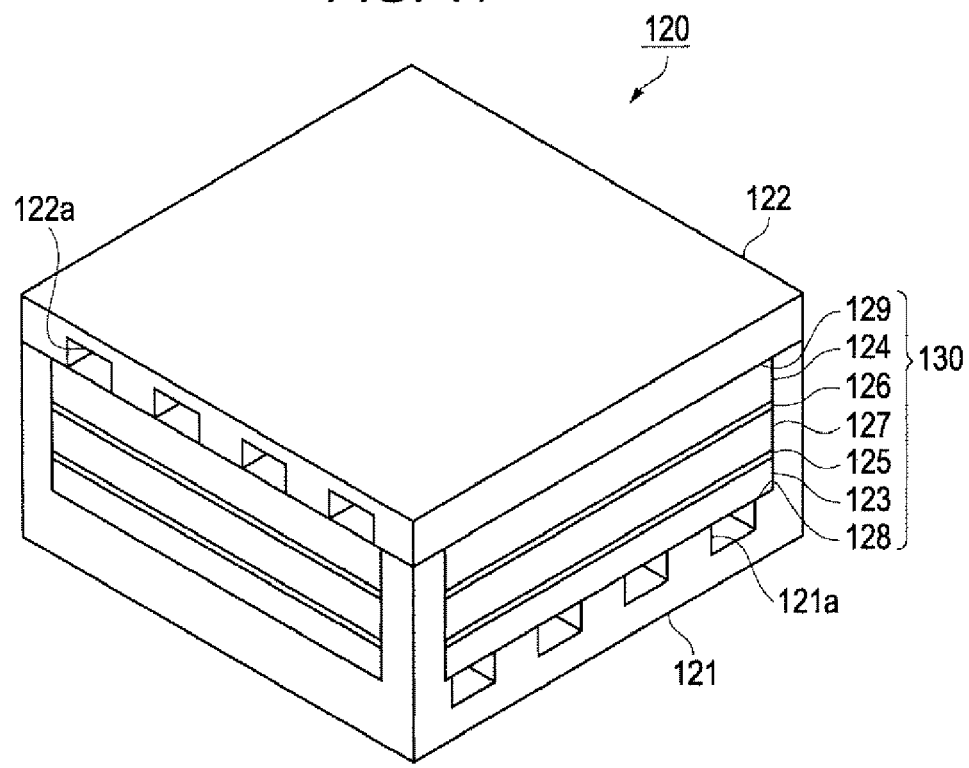
FIG. 11 is a schematic perspective view of a fuel cell in accordance with an embodiment of the invention.

Referring now to FIG. 11, a second embodiment of the invention will be described. FIG. 11 is a schematic perspective view of a fuel cell in accordance with an embodiment of the invention.

A fuel cell 120 shown in FIG. 11 generates electric power by reaction of a hydrogen gas and an oxygen gas. The fuel cell 120 has a structure in which a multilayer film 130 is disposed between two substrates 121 and 122 having gas channels 121*a* and 122*a*, respectively, the multilayer film 130 including electrode layers 128 and 129, gas diffusion layers 123 and 124, catalytic layers 125 and 126, and an ion-exchange layer 127. The electrode layers 128 and 129 are each composed of a conductive material such as copper. The gas diffusion layers 123 and 124 are each composed of porous carbon and the like. The catalytic layers 125 and 126 are each composed of platinum and the like. The ion-exchange layer 127 is composed of an ion-conducting electrolyte, such as Nafion® (manufactured by Du Pont Kabushiki Kaisha). These may be formed by the droplet discharge method.

In the fuel cell 120, the hydrogen gas is introduced into the gas channel 121*a*, oxidized (ionized), passes through the ion-exchange layer 127, and is reduced by the oxygen gas introduced into the gas channel 122*a*, thereby generating electric power. This oxidation-reduction reaction occurs depending on electrical and physical paths among the gas diffusion layers 123 and 124, the catalytic layers 125 and 126, and the ion-exchange layer 127. Therefore, the efficiency increases with increasing the substantial contact areas between these layers.

In the fuel cell in accordance with this embodiment, the gas diffusion layers 123 and 124, the catalytic layers 125 and 126, and the ion-exchange layer 127 are formed in the same way as the gate lines 3 (see FIGS. 7E to 7G) and the luminescent films 50 (see FIGS. 9A to 9D). This improves contact properties between the layers, thus achieving high power generation efficiency.

The invention is not limited to the above-described embodiments.

Examples of the electrooptic device in accordance with an embodiment of the invention include liquid crystal displays, plasma displays, and electron-emitter displays including the driving circuit portion 101.

The process for producing the multilayer film in accordance with an embodiment of the invention may be applied to a multilayer film included in another structure different from the above-described driving circuit, luminescent element, and fuel cell.

The structures described in the above-described embodiments may be combined with each other. Alternatively, the structures may be omitted. Furthermore, the structures may be combined with another structure that is not shown in figure.

What is claimed is:

1. A process for forming a multilayer film, the process comprising:
   forming a metal wiring, the step of forming a metal wiring including:
   (a) discharging a first functional liquid containing a first metal compound on a substrate by a droplet discharge method to form a lower layer;
   (b) solidifying the first functional liquid on the substrate to form a solid lower layer containing the first metal compound;
   (c) forming a liquid layer containing the first metal compound on the solid lower layer;
   (d) discharging a second functional liquid containing a second metal compound on the liquid layer and the solid lower layer by the droplet discharge method to form an upper layer; and
   (e) solidifying the liquid layer and the second functional liquid to form a solid upper layer,
   wherein said first and second metal compounds are each selected from the group consisting of Mn, Ag, and Ni.

2. The process for forming the multilayer film according to claim 1, wherein step (c) is a step of discharging a redissolving liquid on the solid lower layer by the droplet discharge method, the redissolving liquid being used for redissolving the solid lower layer.

3. The process for forming the multilayer film according to claim 2, wherein the redissolving liquid is composed of the liquid component of the first functional liquid.

4. The process for forming the multilayer film according to claim 1, wherein step (c) is a step of discharging the first functional liquid on the solid lower layer by the droplet discharge method.

5. The process for forming the multilayer film according to claim 1, further comprising:
   (a') forming a bank demarcating a predetermined region before step (a).

6. The process for forming the multilayer film according to claim 1, wherein the first and second metal compounds are each different.

7. The process for forming the multilayer film according to claim 6, wherein the first metal compound is Mn, and the second metal compound is Ag.

8. The process for forming the multilayer film according to claim 1, wherein the metal wiring is a gate electrode or a gate line.

9. The process for forming the multilayer film according to claim 8, wherein the lower layer is an underlying gate layer, and the upper layer is a gate conductive layer.

10. The process for forming the multilayer film according to claim 1, further comprising:
    forming a second liquid layer containing the second metal compound on the solid upper layer;
    discharging a third functional liquid containing a third metal compound on the second liquid layer and the solid upper layer by the droplet discharge method to form a cap layer; and
    solidifying the second liquid layer and the third functional liquid to form a solid cap layer,
    wherein the third metal compound is selected from the group consisting of Mn, Ag, and Ni.

11. The process for forming the multilayer film according to claim 10, wherein each of the first metal compound, the second metal compound, and the third metal compound are different.

12. The process for forming the multilayer film according to claim 11, wherein the first metal compound is Mn, the second metal compound is Ag, and the third metal compound is Ni.

13. The process for forming the multilayer film according to claim 10, wherein the metal wiring is a gate electrode or a gate line.

14. The process for forming the multilayer film according to claim 13, wherein the lower layer is an underlying gate layer, the upper layer is a gate conductive layer, and the cap layer is a gate covering layer.

* * * * *